US012740119B2

(12) United States Patent
Yoshida et al.

(10) Patent No.: US 12,740,119 B2
(45) Date of Patent: Sep. 15, 2026

(54) SEMICONDUCTOR DEVICE AND METHOD FOR MANUFACTURING THE SAME

(71) Applicant: Mitsubishi Electric Corporation, Tokyo (JP)

(72) Inventors: Takuya Yoshida, Fukuoka (JP); Kazutoyo Takano, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 351 days.

(21) Appl. No.: 18/624,771

(22) Filed: Apr. 2, 2024

(65) Prior Publication Data

US 2025/0166996 A1 May 22, 2025

(30) Foreign Application Priority Data

Nov. 22, 2023 (JP) ................................ 2023-198659

(51) Int. Cl.

| | |
|---|---|
| ***H10P 52/00*** | (2026.01) |
| ***H10D 64/01*** | (2025.01) |
| ***H10P 54/00*** | (2026.01) |
| ***H10W 20/40*** | (2026.01) |

(52) U.S. Cl.
CPC ......... *H10D 64/0112* (2026.01); *H10P 52/00* (2026.01); *H10P 54/00* (2026.01)

(58) Field of Classification Search
CPC ...... H10P 74/207; H10P 74/23; H10P 74/277; H10P 52/00; H10P 54/00; H10D 64/0112; H10D 64/0115; H10D 62/102; H10D 62/106; H10D 62/108; H10D 62/112
See application file for complete search history.

(56) References Cited

U.S. PATENT DOCUMENTS

| | | | | |
|---|---|---|---|---|
| 9,627,259 | B2 * | 4/2017 | Takano | H10P 54/00 |
| 2003/0020174 | A1 * | 1/2003 | Kohno | H10W 20/40<br>257/E23.105 |
| 2015/0221564 | A1 * | 8/2015 | Yoshida | H10P 74/207<br>438/17 |
| 2017/0278931 | A1 * | 9/2017 | Iguchi | H10D 62/8325 |
| 2020/0365457 | A1 * | 11/2020 | Muri | H10P 54/00 |
| 2021/0384088 | A1 * | 12/2021 | Nakamura | H10P 74/273 |
| 2024/0395621 | A1 * | 11/2024 | Lu | H10P 54/00 |

FOREIGN PATENT DOCUMENTS

| | | |
|---|---|---|
| JP | 2021-128961 A | 9/2021 |

* cited by examiner

*Primary Examiner* — Omar F Mojaddedi
(74) *Attorney, Agent, or Firm* — Studebaker Brackett PLLC

(57) ABSTRACT

A semiconductor device includes: a semiconductor substrate including a device region and a dicing line region surrounding the device region; a front surface electrode provided on a front surface of the semiconductor substrate in the device region; a back surface electrode made of a metal and provided on a back surface opposite the front surface of the semiconductor substrate; a first silicide layer provided between the back surface and the back surface electrode in the device region; and a second silicide layer provided between the back surface and the back surface electrode in the dicing line region, wherein contact resistance between the first silicide layer and the semiconductor substrate is lower than contact resistance between the second silicide layer and the semiconductor substrate, and hardness of the second silicide layer is lower than hardness of the first silicide layer.

13 Claims, 13 Drawing Sheets

SEMICONDUCTOR DEVICE AND METHOD FOR MANUFACTURING THE SAME

BACKGROUND OF THE INVENTION

Field

The present disclosure relates to a semiconductor device and a method for manufacturing the same.

Background

A silicide layer is formed to reduce the contact resistance between a back surface of a semiconductor substrate and a back surface electrode. The silicide layer is formed on the entire back surface of the semiconductor substrate in a wafer state including a dicing line region (for example, see Patent Literature 1).

CITATION LIST

Patent Literature

Patent Literature 1: JP 2021-128961 A

SUMMARY

Technical Problem

To reduce electric resistance, it is necessary to form a silicide layer that forms an excellent ohmic contact with a semiconductor substrate. However, such a silicide layer has high hardness, and thus is resistant to mechanical stress. Therefore, if mechanical stress is applied to the silicide layer during a dicing process, the stress would propagate to the semiconductor substrate and a back surface electrode that are in contact with the silicide layer, with the result that chippings or cracks would occur in a region starting from a crystal defect or a structural stress concentration portion. This results in poor withstand voltage or appearance defects, and thus is problematic.

The present disclosure has been made to solve the foregoing problem, and it is an object of the present disclosure to obtain a semiconductor device that can obtain excellent ohmic characteristics, and thus can suppress the generation of chippings and cracks during a dicing process, and a method for manufacturing such a semiconductor device.

Solution to Problem

A semiconductor device includes: a semiconductor substrate including a device region and a dicing line region surrounding the device region; a front surface electrode provided on a front surface of the semiconductor substrate in the device region; a back surface electrode made of a metal and provided on a back surface opposite the front surface of the semiconductor substrate; a first silicide layer provided between the back surface and the back surface electrode in the device region; and a second silicide layer provided between the back surface and the back surface electrode in the dicing line region, wherein contact resistance between the first silicide layer and the semiconductor substrate is lower than contact resistance between the second silicide layer and the semiconductor substrate, and hardness of the second silicide layer is lower than hardness of the first silicide layer.

A method for manufacturing a semiconductor device includes: forming a front surface electrode on a front surface of a semiconductor substrate in a device region, the semiconductor substrate including the device region and a dicing line region surrounding the device region; forming a metal film on a back surface opposite the front surface of the semiconductor substrate; and alloying the semiconductor substrate and the metal film through heat treatment to form a first silicide layer on the back surface in the device region and to form a second silicide layer on the back surface in the dicing line region, wherein contact resistance between the first silicide layer and the semiconductor substrate is lower than contact resistance between the second silicide layer and the semiconductor substrate, and hardness of the second silicide layer is lower than hardness of the first silicide layer.

Advantageous Effects of Invention

In the present disclosure, the first silicide layer in the device region is formed such that it has low contact resistance with the semiconductor substrate. Accordingly, excellent ohmic characteristics can be obtained between the semiconductor substrate and the back surface electrode in the device region. Meanwhile, the second silicide layer in the dicing line region is formed such that it has low hardness. This can reduce mechanical stress applied while the second silicide layer is cut during a dicing process, and thus can suppress the propagation of the stress to the semiconductor substrate in contact with the second silicide layer. Consequently, the generation of chippings and cracks can be suppressed during the dicing process.

BRIEF DESCRIPTION OF DRAWINGS

FIG. 1 is a top view illustrating a semiconductor wafer according to a first embodiment.

DESCRIPTION OF EMBODIMENTS

A semiconductor device and a method for manufacturing the same according to the embodiments of the present disclosure will be described with reference to the drawings. The same components will be denoted by the same symbols, and the repeated description thereof may be omitted.

First Embodiment

Figure 1:
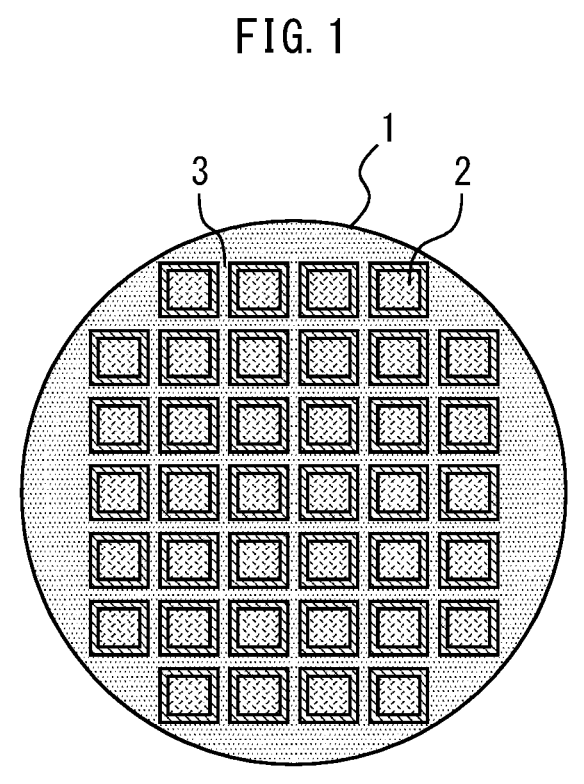

FIG. 1 is a top view illustrating a semiconductor wafer according to a first embodiment. A plurality of device regions 2 are regularly arranged in a matrix of rows and columns on a semiconductor substrate 1 in a wafer state. A dicing line region 3 surrounds each device region 2.

Figure 2:
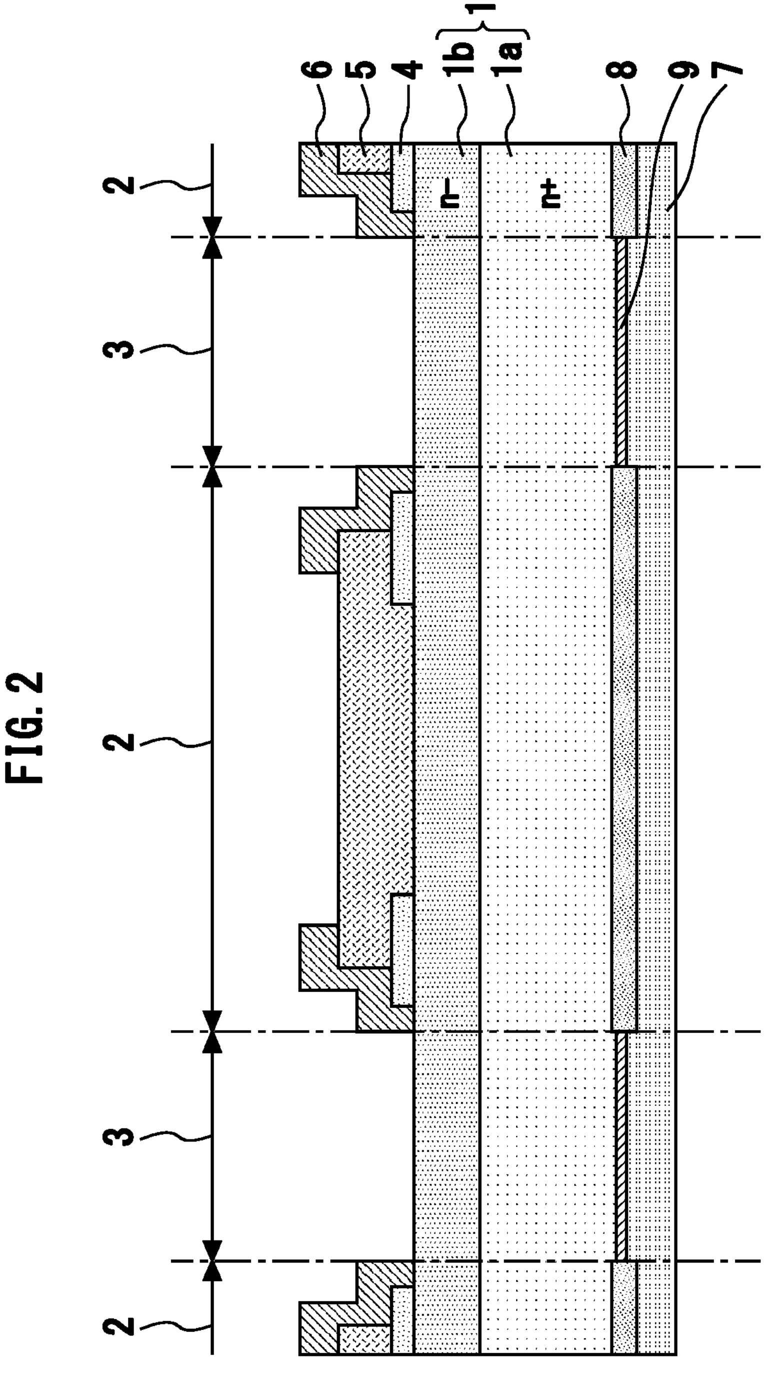
FIG. 2 is a cross-sectional view illustrating the semiconductor device according to the first embodiment.

FIG. 2 is a cross-sectional view illustrating the semiconductor device according to the first embodiment. The semiconductor substrate 1 is formed of silicon or silicon carbide. The semiconductor substrate 1 includes a high-concentration n-type layer 1*a*, and an n-type drift layer 1*b* provided thereon. The high-concentration n-type layer 1*a* has a higher concentration of n-type impurities than the n-type drift layer 1*b*. Note that the n-type drift layer 1*b* may be provided on a single-crystalline high-concentration p-type layer, or the n-type drift layer 1*b* that is single-crystalline may be provided alone.

A vertical MOSFET, a diode, or an IGBT is provided in each device region 2 of the semiconductor substrate 1, for example. In such a case, p-type layers, n-type layers, and projections and recesses, such as trenches, are partially or entirely provided on the front surface side or the back surface side of the semiconductor substrate 1. In addition, the device region 2 includes an active region through which a current flows during the operation of the device, a termination region provided around the active region to hold the withstand voltage, and a region where a gate pad is formed, for example. A diffusion layer, such as a p-type base layer, is formed in the active region. However, the diffusion layer need not necessarily be provided in the device region 2 because there may be a case where a Schottky barrier diode is provided or where the semiconductor substrate 1 is used as a resistive element.

In the device region 2, an interlayer dielectric 4, a front surface electrode 5 and a protective film 6 are provided on the front surface of the semiconductor substrate 1. The front surface electrode 5 is connected to the front surface of the semiconductor substrate 1 through an opening of the interlayer dielectric 4. The protective film 6 protects the outer periphery portion of the front surface electrode 5 by covering it.

The front surface electrode 5 is formed of a metal film of one or more types of metals. For example, the front surface electrode 5 is formed of a metal film containing titanium (Ti) or aluminum (Al). A plating film may be formed on the metal film using electroless plating or electrolytic plating. The protective film 6 is made of at least one of silicon nitride (SiN), SInSiN (Semi-Insulating Silicon Nitride), or polyimide, for example.

The interlayer dielectric 4, the front surface electrode 5, and the protective film 6 are not provided in the dicing line region 3. Removing materials with hardness that is different from the hardness of the semiconductor substrate 1 from the dicing line region 3 can reduce mechanical stress that would be applied during a dicing process.

A back surface electrode 7 made of a metal is provided on the back surface on the opposite side of the front surface of the semiconductor substrate 1. The back surface electrode 7 is formed of a metal film of one or more types of materials as with the front surface electrode 5, and a plating film may be formed on the metal film. In the device region 2, a first silicide layer 8 is provided between the back surface of the semiconductor substrate 1 and the back surface electrode 7. In the dicing line region 3, a second silicide layer 9 is provided between the back surface of the semiconductor substrate 1 and the back surface electrode 7. The first silicide layer 8 and the second silicide layer 9 are in contact with the back surface of the semiconductor substrate 1.

Figure 3:
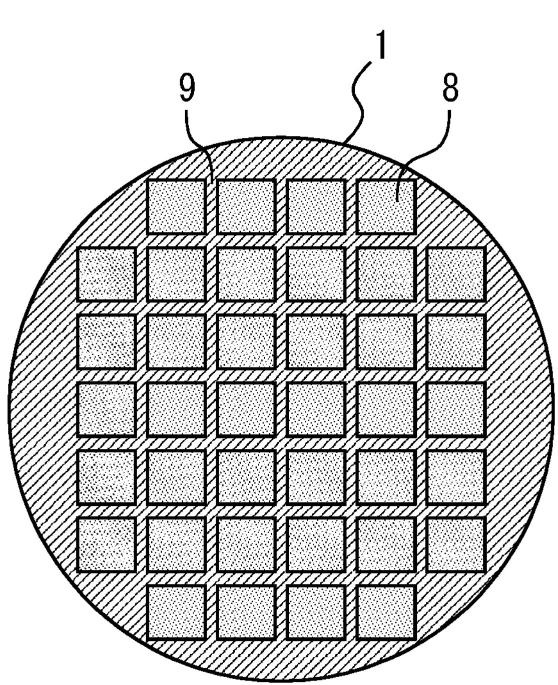
FIG. 3 is a bottom view illustrating the silicide layers on the back surface of the semiconductor wafer according to the first embodiment.

FIG. 3 is a bottom view illustrating the silicide layers on the back surface of the semiconductor wafer according to the first embodiment. The first silicide layer 8 is provided in each device region 2. The second silicide layer 9 is provided in each region other than the device regions 2, such as in each dicing line region 3.

Each of the first silicide layer 8 and the second silicide layer 9 is made of a metal compound containing silicon (Si). Specifically, it is formed of one of a titanium silicide film ($Ti_5Si_3$, TiSi, or $TiSi_2$), a titanium silicon carbide film ($Ti_3SiC_2$), a nickel silicide film ($Ni_2Si$, NiSi, or $NiSi_2$), a molybdenum silicide film ($Mo_3Si$, $Mo_5Si_3$, or $MoSi_2$), an aluminum silicide film (Al—Si), or a tungsten silicide film ($W_5Si_3$ or $WSi_2$). The materials of the first silicide layer 8 and the second silicide layer 9 may be a combination of compounds of dissimilar metal elements, or a combination of compounds of identical metal elements with different composition ratios.

The contact resistance between the first silicide layer 8 and the semiconductor substrate 1 is lower than the contact resistance between the second silicide layer 9 and the semiconductor substrate 1. Therefore, the first silicide layer 8 can obtain excellent ohmic characteristics. Meanwhile, although the second silicide layer 9 has high contact resistance with the semiconductor substrate 1, it has no influence on the electric characteristics of the semiconductor device because the second silicide layer 9 is formed in the dicing line region 3. Further, a metal compound with high contact resistance tends to have low hardness. The second silicide layer 9 in the dicing line region 3 has lower hardness than the first silicide layer 8 and is thinner than the first silicide layer 8. Therefore, mechanical stress applied while the second silicide layer 9 is cut during a dicing process can be reduced.

Figure 4:
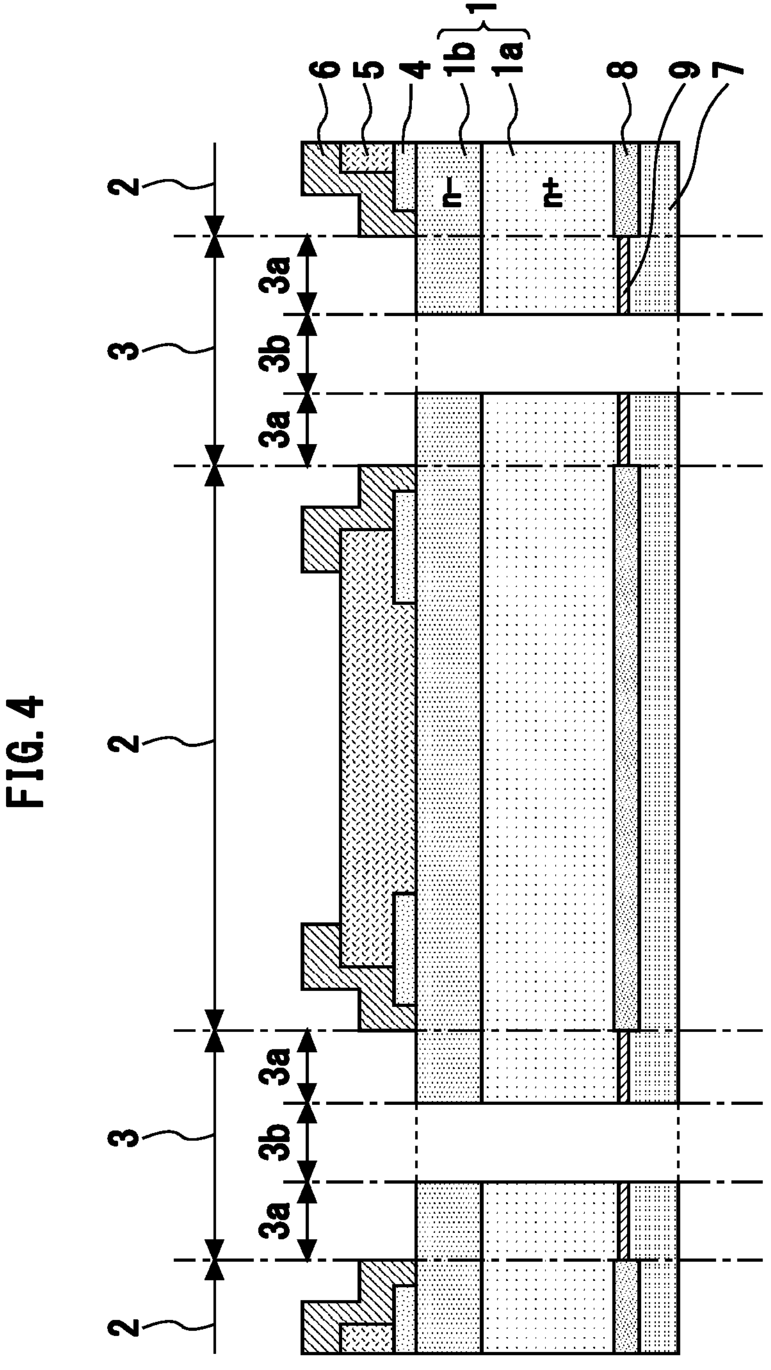
FIG. 4 is a cross-sectional view illustrating the semiconductor device according to the first embodiment obtained through individualization in a dicing process.
Figure 5:
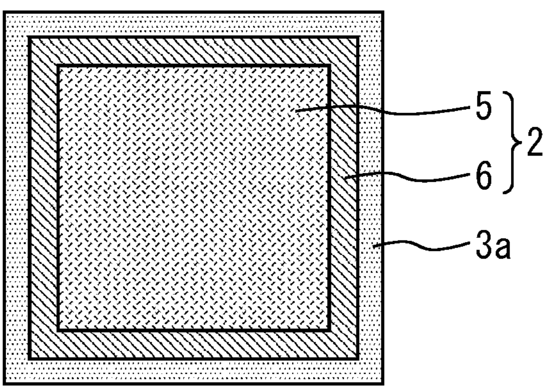
FIG. 5 is a top view illustrating the semiconductor device according to the first embodiment obtained through individualization.
Figure 6:
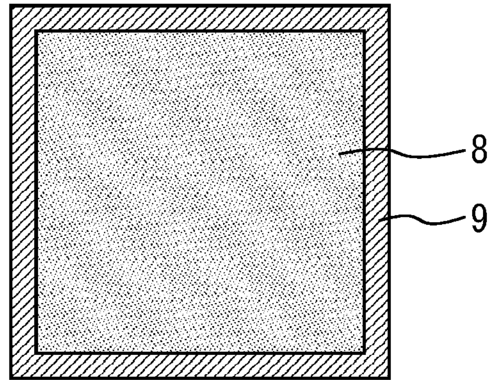
FIG. 6 is a bottom view illustrating the semiconductor device according to the first embodiment obtained through individualization.

FIG. 4 is a cross-sectional view illustrating the semiconductor device according to the first embodiment obtained through individualization in a dicing process. FIG. 5 is a top view illustrating the semiconductor device according to the first embodiment obtained through individualization. FIG. 6 is a bottom view illustrating the semiconductor device according to the first embodiment obtained through individualization. Note that the semiconductor substrate 1 in a wafer state is attached to a dicing sheet (not illustrated) during the dicing process.

Each dicing line region 3 is divided into invalid regions 3*a* and a dicing cutting region 3*b* through a dicing process. The invalid regions 3*a* are adjacent to the device regions 2. Each semiconductor device obtained through individualization at least partially includes the invalid regions 3*a*. In the invalid regions 3*a*, the second silicide layer 9 is provided on the back surface of the semiconductor substrate 1.

The cut width of the dicing process performed with a blade is about 30 μm. Thus, it is preferable to set the width of the dicing line region 3 to 30+α μm by adding the positional accuracy a of the blade. That is, the width of the dicing line region 3 is preferably greater than or equal to 30 μm. Accordingly, the second silicide layer can be formed in the entire region through which the dicing blade is adapted to pass.

Figure 7:
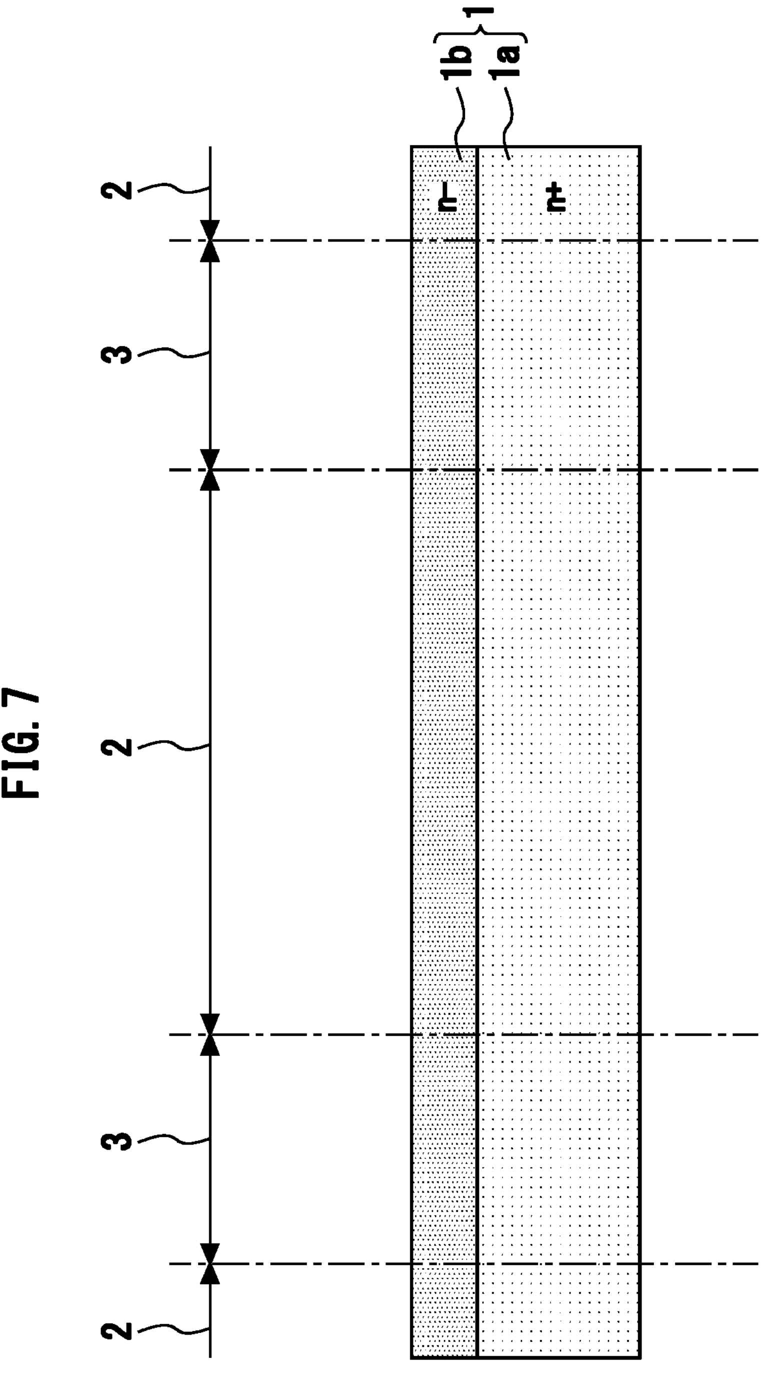
FIG. 7 is a cross-sectional view illustrating a method for manufacturing the semiconductor device according to the first embodiment.

FIGS. 7 to 10 are cross-sectional views illustrating a method for manufacturing the semiconductor device according to the first embodiment. First, as illustrated in FIG. 7, the semiconductor substrate 1 is formed by epitaxially growing the n-type drift layer 1*b* on the single-crystalline high-concentration n-type layer 1*a*.

Figure 8:
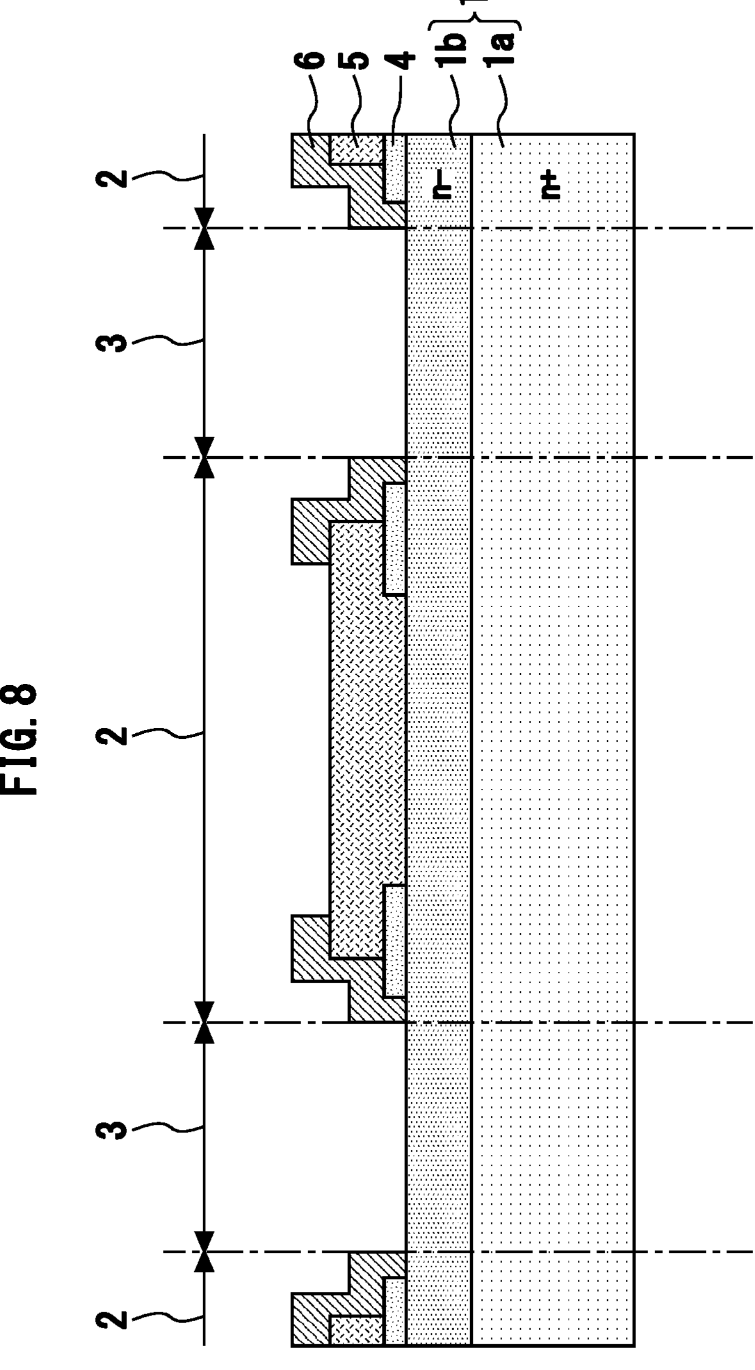
FIG. 8 is a cross-sectional view illustrating a method for manufacturing the semiconductor device according to the first embodiment.

Next, as illustrated in FIG. 8, the interlayer dielectric 4, the front surface electrode 5, and the protective film 6 are partially formed on the front surface of the semiconductor substrate 1 through a mask process. Note that p-type layers, n-type layers, and projections and recesses, such as trenches, may be partially or entirely formed on the front surface side or the back surface side of the semiconductor substrate 1 through ion implantation or etching. The thickness of the semiconductor substrate 1 may be reduced through processing.

Figure 9:
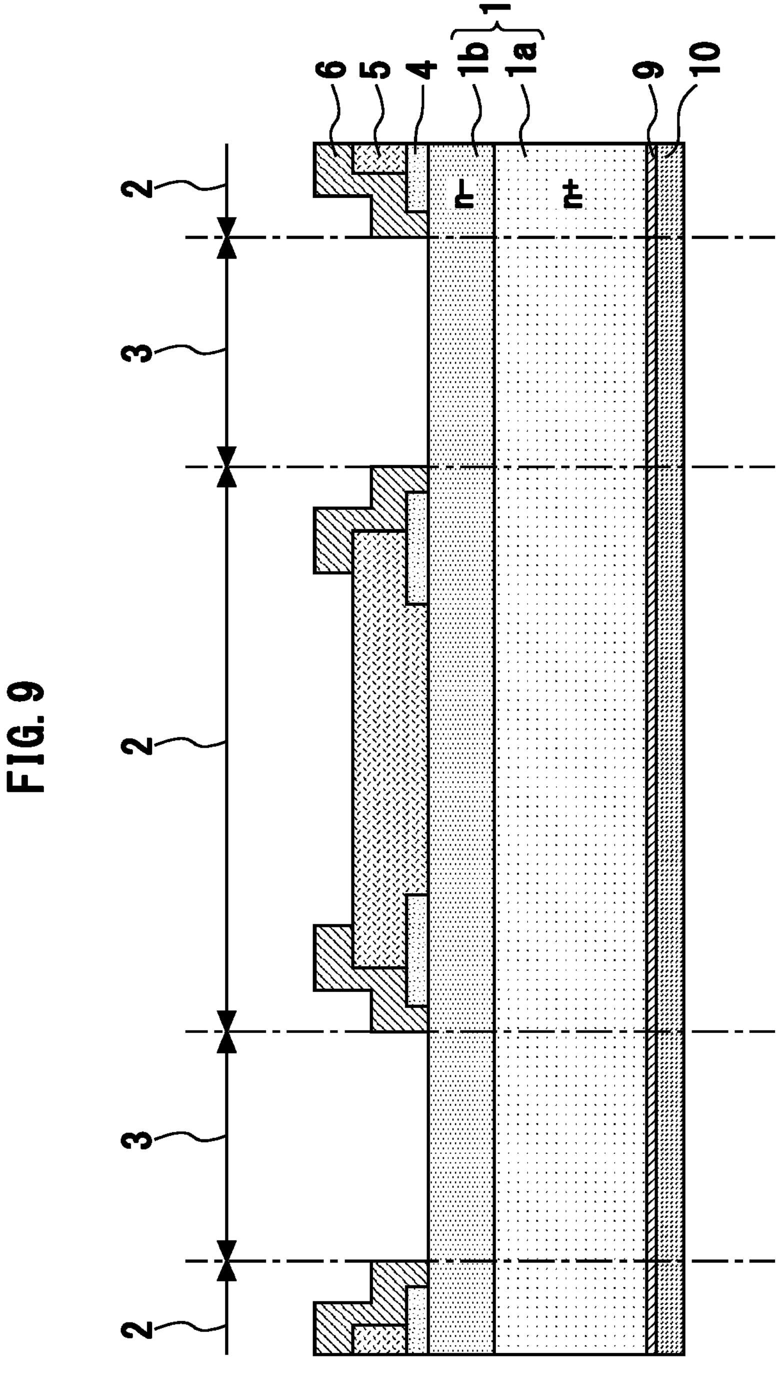
FIG. 9 is a cross-sectional view illustrating a method for manufacturing the semiconductor device according to the first embodiment.

Next, as illustrated in FIG. 9, a metal film 10 is formed on the back surface of the semiconductor substrate 1 using a sputtering method or vapor deposition. Heat treatment is applied to the metal film 10. Accordingly, silicon of the semiconductor substrate 1 and metal atoms of the metal film 10 are mutually diffused so that the second silicide layer 9 is formed. The heat treatment method include sintering, RTA (Rapid Thermal Anneal), FLA (Flash Lamp Anneal), or laser annealing. The temperature of the heat treatment is set to a relatively low temperature of about 300 to 800° C. Accordingly, the second silicide layer 9, which has high contact resistance with the semiconductor substrate 1, and is thin, is formed.

The second silicide layer 9 may be formed with the energy of metal ions depositing in the sputtering process. Further, the temperature of the sputtering process may be adjusted to accelerate the alloying of the metal ions. Furthermore, performing etching (i.e., sputter etching) on the back surface of the semiconductor substrate 1 during the sputtering process can form crystal strains in the semiconductor substrate 1, which in turn can generate the second silicide layer 9 with high contact resistance more easily. Forming the second silicide layer 9 by adjusting the conditions of the sputtering process in this manner can reduce the number of steps of the heat treatment.

Figure 10:
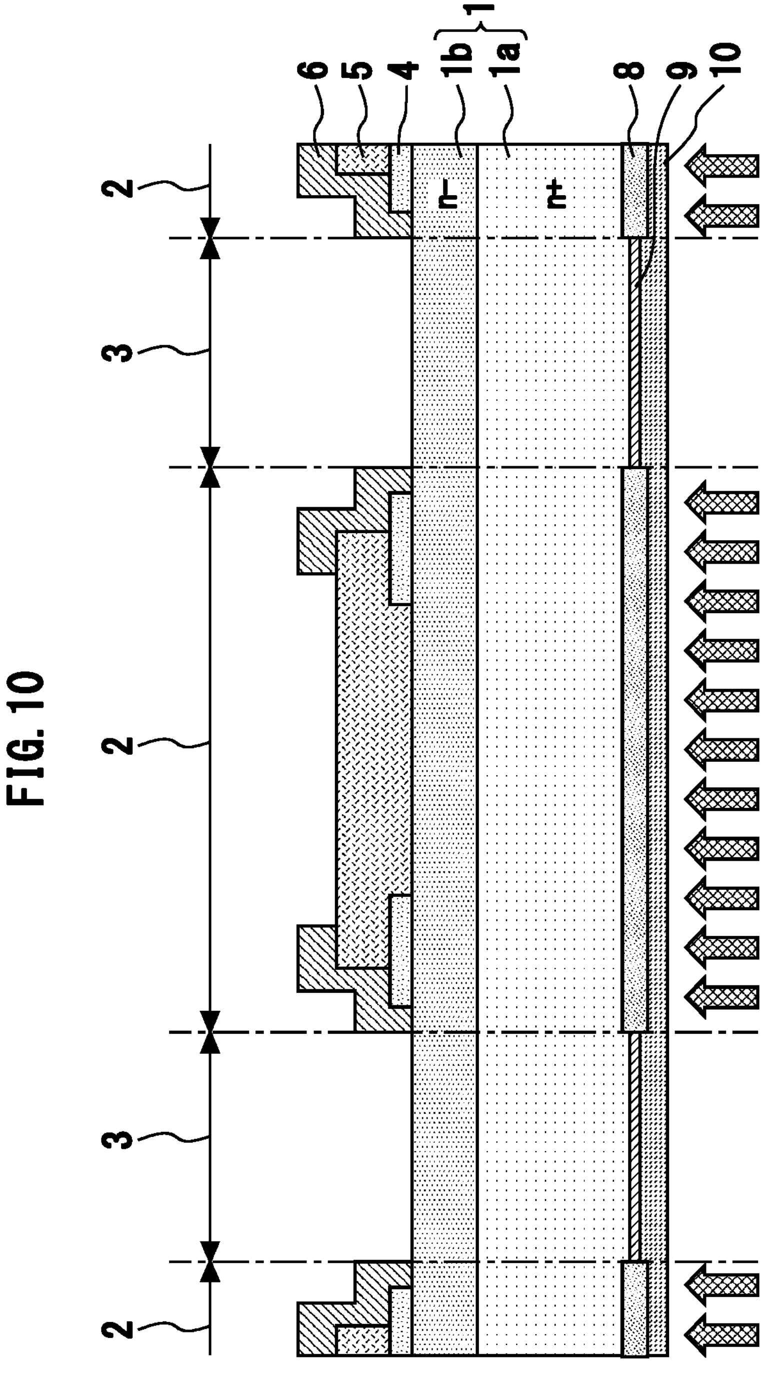
FIG. 10 is a cross-sectional view illustrating a method for manufacturing the semiconductor device according to the first embodiment.

Next, as illustrated in FIG. 10, the back surface of the semiconductor substrate 1 is irradiated with a laser beam only in the device region 2. This promotes the thermal reaction of the silicide in the device region 2 so that the first silicide layer 8 is formed. The temperature of the heat treatment herein is set higher than the temperature for forming the second silicide layer 9, for example, to a temperature of greater than or equal to 800° C. Consequently, the first silicide layer 8 becomes thicker than the second silicide layer 9, and has a higher composition ratio of silicon to the metal element than the second silicide layer 9.

Then, the back surface electrode 7 is formed on the back surface of the semiconductor substrate 1 using a sputtering method, vapor deposition, electroless plating, or electrolytic plating, for example. Note that the metal film 10 may be entirely alloyed as the silicide layer, or the remaining part of the metal film 10 may be used as the back surface electrode 7. The semiconductor device according to the present embodiment is produced through the foregoing steps.

As described above, in this embodiment, the first silicide layer 8 in the device region 2 is formed such that it has low contact resistance with the semiconductor substrate 1. Accordingly, excellent ohmic characteristics can be obtained between the semiconductor substrate 1 and the back surface electrode 7 in the device region 2. Meanwhile, the second silicide layer 9 in the dicing line region 3 is formed such that it has low hardness. This can reduce mechanical stress applied while the second silicide layer 9 is cut during a dicing process, and thus can suppress the propagation of the stress to the semiconductor substrate 1 in contact with the second silicide layer 9. Consequently, the generation of chippings and cracks can be suppressed during the dicing process.

In addition, the second silicide layer 9 is thinner than the first silicide layer 8. Accordingly, mechanical stress applied while the second silicide layer 9 is cut through the dicing process can be further reduced.

Further, the first silicide layer 8 in the device region 2 has a higher composition ratio of silicon to the metal element than the second silicide layer 9 in the dicing line region 3. Accordingly, the first silicide layer 8 can obtain an excellent ohmic contact with the semiconductor substrate 1. For example, the first silicide layer 8 contains $TiSi_2$, and the second silicide layer 9 contains $Ti_5Si_3$. Therefore, since the first silicide layer 8 has a high composition ratio of silicon, it has low contact resistance with the semiconductor substrate 1, and thus can obtain excellent ohmic characteristics. Meanwhile, since the second silicide layer 9 has a high composition ratio of the metal element, it has high contact resistance with the semiconductor substrate 1. However, since the second silicide layer 9 has a sparse crystal lattice, it has low hardness. This can suppress the propagation of stress to the semiconductor substrate 1 while the second silicide layer 9 is cut during a dicing process.

The first silicide layer 8 and the second silicide layer 9 may be silicide layers with different crystal structures. Note that the crystal structure of the first silicide layer 8 in the device region 2 has lower resistivity than the crystal structure of the second silicide layer 9. Therefore, on-voltage can be reduced. For example, the first silicide layer contains titanium silicide ($TiSi_2$) with a C54 structure (i.e., face-centered orthorhombic), and the second silicide layer contains $TiSi_2$ with a C49 structure (i.e., base-centered orthorhombic). Silicide with the C54 structure has a dense atom arrangement, and thus has excellent ohmic characteristics and has high hardness. Titanium silicide with the C49 structure has a resistivity of about 60 μΩ·cm, and titanium silicide with the C54 structure has a resistivity of about 15 to 20 μΩ·cm. Thus, excellent electric resistance can be obtained in the device region 2. The C49 structure is formed at a temperature as low as about 400° C., while the C54 structure is formed at a temperature as high as about 800° C. Thus, it is possible to separately form the first silicide layer 8 and the second silicide layer 9 by adjusting the heat treatment conditions for forming the silicide.

The first silicide layer 8 and the second silicide layer 9 may be silicide layers with different types of crystallinity. For example, the second silicide layer 9 may be in a quasicrystalline or amorphous (i.e., non-crystalline) state. Amorphous titanium silicide has lower hardness than crystalline titanium silicide. Thus, the propagation of stress to the semiconductor substrate 1 can be suppressed while the second silicide layer 9 is diced. Meanwhile, the first silicide layer 8 is formed of a metal compound containing crystalline silicon to obtain excellent ohmic characteristics. Crystalline silicide has a dense atom arrangement, and thus has excellent ohmic characteristics and has high hardness. Note that crystal strains in the semiconductor substrate 1 occur due to damage caused by a sputtering process performed thereon or occur when etching (i.e., sputter etching) is performed on the front surface of the semiconductor substrate 1. When a metal film is formed thereafter, the metal element enters the gap between the crystals so that a layer in a quasicrystalline or amorphous state is formed. After that, heat treatment is applied only to the device region 2 so that the first silicide layer 8 in a crystalline state is formed. Meanwhile, the layer in the dicing line region 3 not subjected to the heat treatment remains as the second silicide layer 9 in a quasicrystalline or amorphous state.

Second Embodiment

FIGS. 11 to 14 are cross-sectional views illustrating a method for manufacturing a semiconductor device according to a second embodiment. First, the semiconductor substrate 1 is formed, and then, the interlayer dielectric 4, the front surface electrode 5, and the protective film 6 are partially formed on the front surface of the semiconductor substrate 1 as in the first embodiment.

Figure 11:
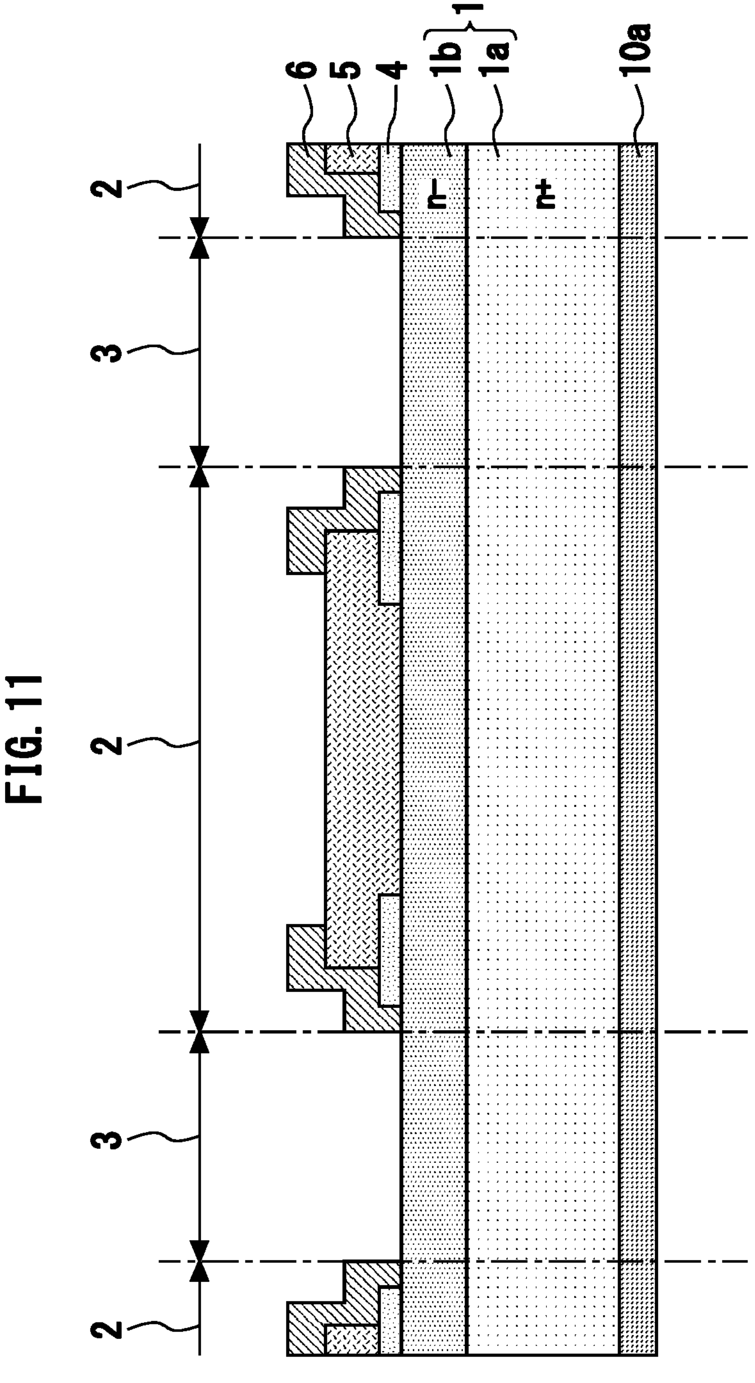
FIG. 11 is a cross-sectional view illustrating a method for manufacturing a semiconductor device according to a second embodiment.

Next, as illustrated in FIG. 11, a first metal film 10*a* is formed on the back surface of the semiconductor substrate 1 using a sputtering method or vapor deposition. At this time, a given silicide layer may be formed between the semiconductor substrate 1 and the first metal film 10*a*.

Figure 12:
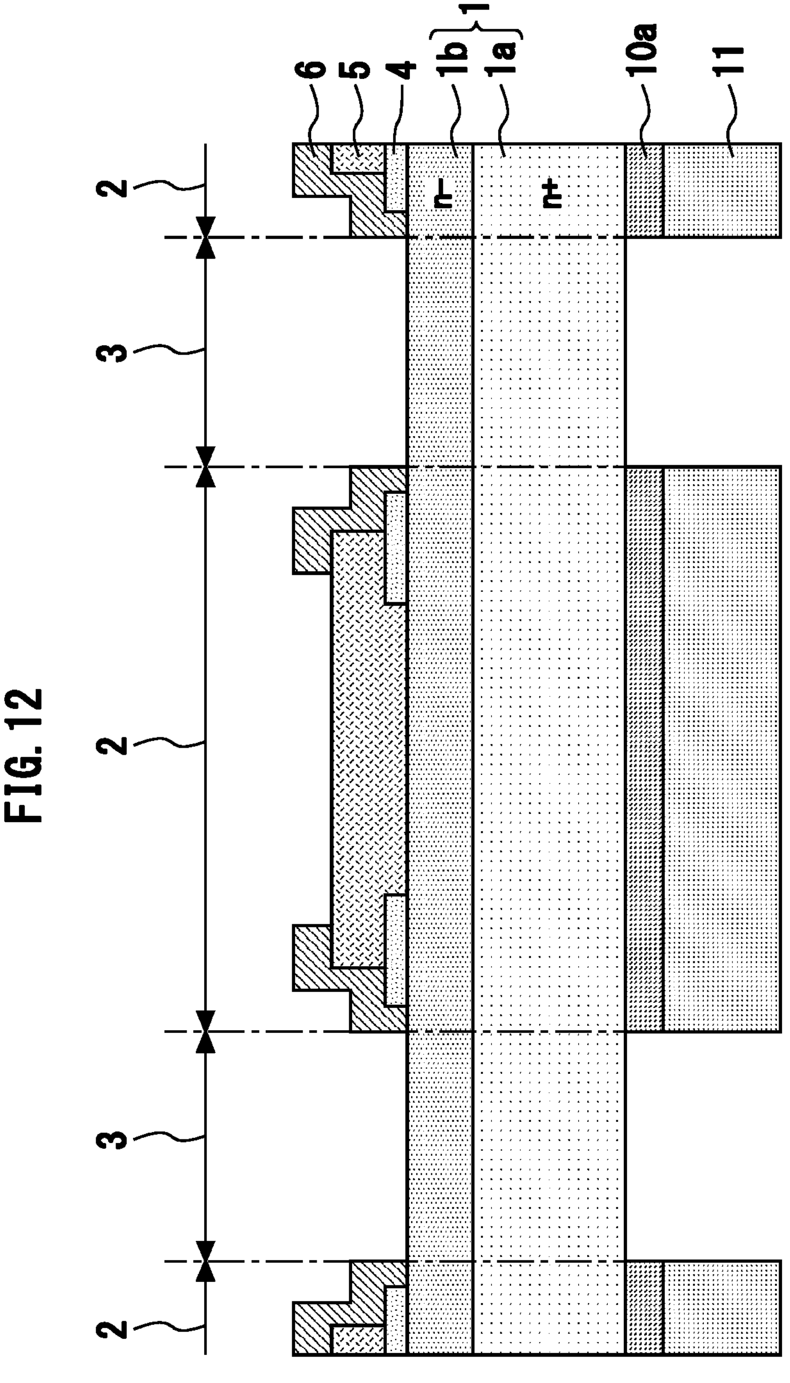
FIG. 12 is a cross-sectional view illustrating a method for manufacturing a semiconductor device according to a second embodiment.

Next, as illustrated in FIG. 12, a resist 11 is formed on the back surface side of the semiconductor substrate 1 in the device region 2. Then, etching is performed using the resist 11 as a mask to remove the first metal film 10*a* in the dicing line region 3. When the given silicide layer is formed on the back surface side of the semiconductor substrate 1 in the dicing line region 3, such a silicide layer is removed at the same time. Then, the resist 11 is removed.

Figure 13:
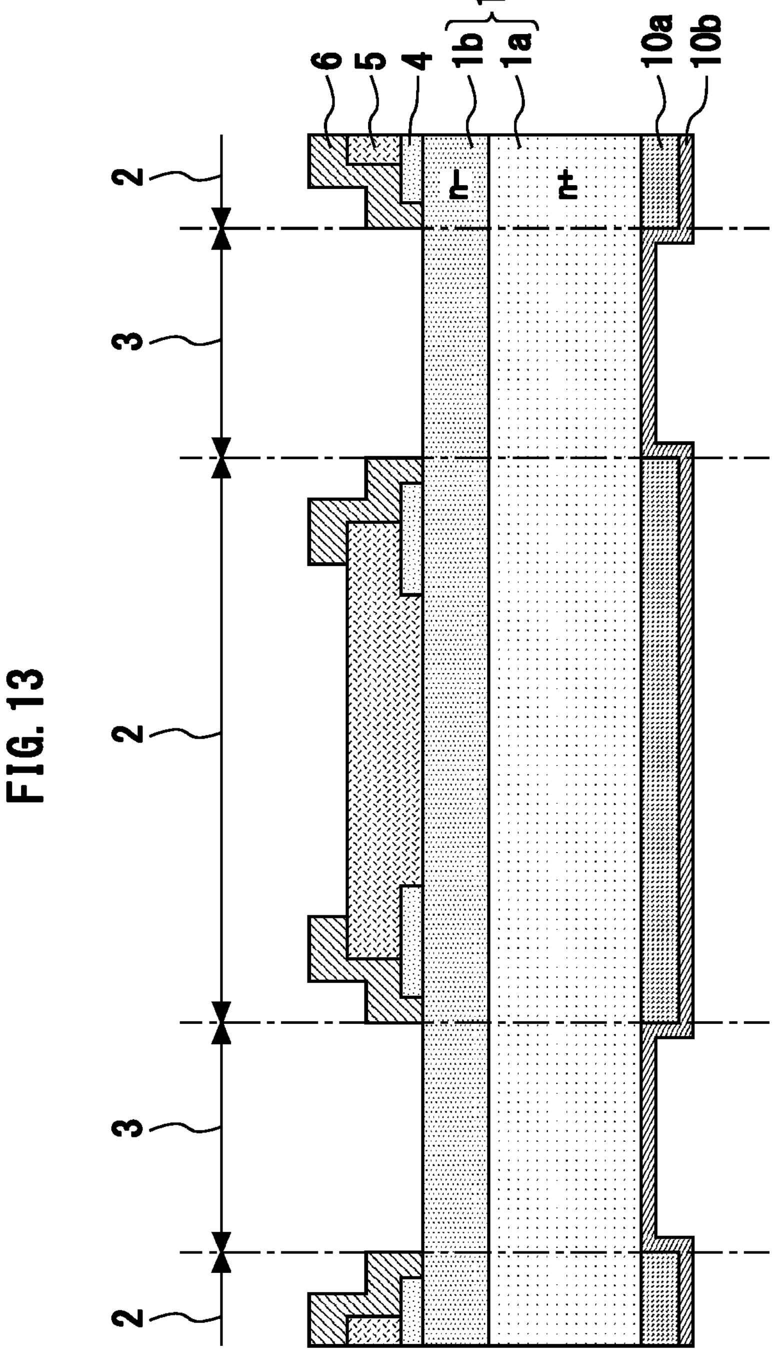
FIG. 13 is a cross-sectional view illustrating a method for manufacturing a semiconductor device according to a second embodiment.

Next, as illustrated in FIG. 13, a second metal film 10*b* is formed on the exposed back surface of the semiconductor substrate 1 using a sputtering method or vapor deposition. At this time, a given silicide layer may be formed between the semiconductor substrate 1 and the second metal film 10*b*. Note that the first metal film 10*a* and the second metal film 10*b* may be made of the same type of metal or dissimilar metals.

Figure 14:
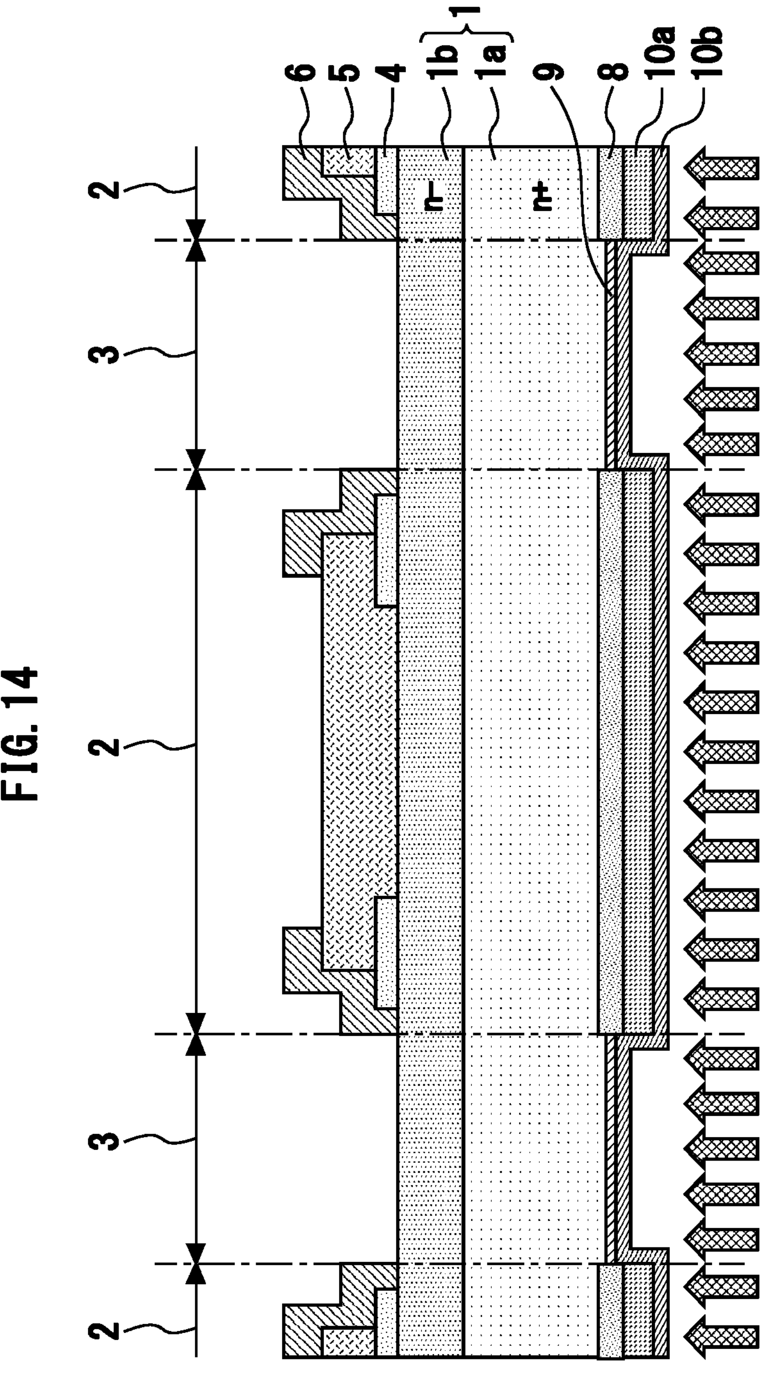
FIG. 14 is a cross-sectional view illustrating a method for manufacturing a semiconductor device according to a second embodiment.

Next, as illustrated in FIG. 14, laser annealing is performed by irradiating the entire back surface of the semiconductor substrate 1 with a laser beam. Accordingly, the semiconductor substrate 1 and the first metal film 10*a* thermally react to form the second silicide layer 9, and also, the semiconductor substrate 1 and the second metal film 10*b* thermally react to form the first silicide layer 8.

As the first metal film 10*a*, the type of metal with excellent ohmic characteristics is selected. For example, titanium is selected as the first metal film 10*a* for the n-type semiconductor substrate 1. Meanwhile, aluminum is selected as the second metal film 10*b*.

When a thick metal film is formed, silicide that is formed through heat treatment also becomes thick. Thus, the first metal film 10*a* is formed thicker than the second metal film 10*b*. Accordingly, the first silicide layer 8 in the device region 2 becomes thick.

The laser annealing conditions are adjusted to perform heat treatment sufficient for the thickness of the first metal film 10*a*. Accordingly, the first silicide layer 8 can be formed thicker than the second silicide layer 9, and thus can obtain an excellent ohmic contact with the semiconductor substrate 1. Note that if sufficient heat treatment is not performed, there will be only a smaller difference in the thickness between the first silicide layer 8 and the second silicide layer 9.

In this embodiment, the second silicide layer 9 and the first silicide layer 8 of dissimilar metal elements can be formed. In addition, the first silicide layer 8 and the second silicide layer 9 can be formed at a time by irradiating the entire surface with a laser beam without performing pattern irradiation during the laser annealing. The other configurations and advantageous effects of this embodiment are similar to those of the first embodiment.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

Supplementary Note 1

A semiconductor device comprising:

a semiconductor substrate including a device region and a dicing line region surrounding the device region;

a front surface electrode provided on a front surface of the semiconductor substrate in the device region;

a back surface electrode made of a metal and provided on a back surface opposite the front surface of the semiconductor substrate;

a first silicide layer provided between the back surface and the back surface electrode in the device region; and a second silicide layer provided between the back surface and the back surface electrode in the dicing line region, wherein contact resistance between the first silicide layer and the semiconductor substrate is lower than contact resistance between the second silicide layer and the semiconductor substrate, and hardness of the second silicide layer is lower than hardness of the first silicide layer.

Supplementary Note 2

The semiconductor device according to Supplementary Note 1, wherein the second silicide layer is thinner than the first silicide layer.

Supplementary Note 3

The semiconductor device according to Supplementary Note 1 or 2, wherein the first silicide layer has a higher composition ratio of silicon to metal element than the second silicide layer.

Supplementary Note 4

The semiconductor device according to Supplementary Note 1 or 2, wherein a crystal structure of the first silicide layer has lower resistivity than a crystal structure of the second silicide layer.

Supplementary Note 5

The semiconductor device according to Supplementary Note 1 or 2, wherein the first silicide layer is in a crystalline state, and the second silicide layer is in a quasicrystalline or amorphous state.

Supplementary Note 6

The semiconductor device according to any one of Supplementary Notes 1 to 5, wherein a plurality of the device regions are arranged in a matrix of rows and columns on the semiconductor substrate in a wafer state.

Supplementary Note 7

The semiconductor device according to any one of Supplementary Notes 1 to 6, wherein the front surface electrode is not provided on the front surface in the dicing line region.

Supplementary Note 8

The semiconductor device according to any one of Supplementary Notes 1 to 7, wherein a width of the dicing line region is greater than or equal to 30 μm.

Supplementary Note 9

The semiconductor device according to any one of Supplementary Notes 1 to 8, wherein the semiconductor substrate is formed of silicon or silicon carbide.

Supplementary Note 10

A method for manufacturing a semiconductor device comprising:

- forming a front surface electrode on a front surface of a semiconductor substrate in a device region, the semiconductor substrate including the device region and a dicing line region surrounding the device region;
- forming a metal film on a back surface opposite the front surface of the semiconductor substrate; and
- alloying the semiconductor substrate and the metal film through heat treatment to form a first silicide layer on the back surface in the device region and to form a second silicide layer on the back surface in the dicing line region,
- wherein contact resistance between the first silicide layer and the semiconductor substrate is lower than contact resistance between the second silicide layer and the semiconductor substrate, and
- hardness of the second silicide layer is lower than hardness of the first silicide layer.

Supplementary Note 11

The method for manufacturing a semiconductor device according to Supplementary Note 10, wherein a temperature of the heat treatment for the device region is higher than a temperature of the heat treatment for the dicing line region.

Supplementary Note 12

The method for manufacturing a semiconductor device according to Supplementary Note 10 or 11, wherein as the metal film, a first metal film is formed in the device region, and a second metal film different from the first metal film is formed in the dicing line region.

Supplementary Note 13

The method for manufacturing a semiconductor device according to Supplementary Note 12, wherein laser annealing is performed on an entire back surface of the semiconductor substrate so that the semiconductor substrate and the first metal film are alloyed to form the first silicide layer, and the semiconductor substrate and the second metal film are alloyed to form the second silicide layer.

REFERENCE SIGNS LIST

1 semiconductor substrate; 2 device region; 3 dicing line region; 5 front surface electrode; 7 back surface electrode; 8 first silicide layer; 9 second silicide layer; 10 metal film; 10*a* first metal film; 10*b* second metal film Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2023-198659, filed on Nov. 22, 2023 including specification, claims, drawings and summary, on which the convention priority of the present application is based, is incorporated herein by reference in its entirety.

The invention claimed is:

1. A semiconductor device comprising:
- a semiconductor substrate including a device region and a dicing line region surrounding the device region;
- a front surface electrode provided on a front surface of the semiconductor substrate in the device region;
- a back surface electrode made of a metal and provided on a back surface opposite the front surface of the semiconductor substrate;
- a first silicide layer provided between the back surface and the back surface electrode in the device region; and
- a second silicide layer provided between the back surface and the back surface electrode in the dicing line region,
- wherein contact resistance between the first silicide layer and the semiconductor substrate is lower than contact resistance between the second silicide layer and the semiconductor substrate, and
- hardness of the second silicide layer is lower than hardness of the first silicide layer.

2. The semiconductor device according to claim 1, wherein the second silicide layer is thinner than the first silicide layer.

3. The semiconductor device according to claim 1, wherein the first silicide layer has a higher composition ratio of silicon to metal element than the second silicide layer.

4. The semiconductor device according to claim 1, wherein a crystal structure of the first silicide layer has lower resistivity than a crystal structure of the second silicide layer.

5. The semiconductor device according to claim 1, wherein the first silicide layer is in a crystalline state, and the second silicide layer is in a quasicrystalline or amorphous state.

6. The semiconductor device according to claim 1, wherein a plurality of the device regions are arranged in a matrix of rows and columns on the semiconductor substrate in a wafer state.

7. The semiconductor device according to claim 1, wherein the front surface electrode is not provided on the front surface in the dicing line region.

8. The semiconductor device according to claim 1, wherein a width of the dicing line region is greater than or equal to 30 μm.

9. The semiconductor device according to claim 1, wherein the semiconductor substrate is formed of silicon or silicon carbide.

10. A method for manufacturing a semiconductor device comprising:

forming a front surface electrode on a front surface of a semiconductor substrate in a device region, the semiconductor substrate including the device region and a dicing line region surrounding the device region;

forming a metal film on a back surface opposite the front surface of the semiconductor substrate; and alloying the semiconductor substrate and the metal film through heat treatment to form a first silicide layer on the back surface in the device region and to form a second silicide layer on the back surface in the dicing line region, wherein contact resistance between the first silicide layer and the semiconductor substrate is lower than contact resistance between the second silicide layer and the semiconductor substrate, and hardness of the second silicide layer is lower than hardness of the first silicide layer.

11. The method for manufacturing a semiconductor device according claim 10, wherein a temperature of the heat treatment for the device region is higher than a temperature of the heat treatment for the dicing line region.

12. The method for manufacturing a semiconductor device according claim 10, wherein as the metal film, a first metal film is formed in the device region, and a second metal film different from the first metal film is formed in the dicing line region.

13. The method for manufacturing a semiconductor device according claim 12, wherein laser annealing is performed on an entire back surface of the semiconductor substrate so that the semiconductor substrate and the first metal film are alloyed to form the first silicide layer, and the semiconductor substrate and the second metal film are alloyed to form the second silicide layer.

* * * * *